United States Patent [19]

Russell et al.

[11] Patent Number: 5,512,832
[45] Date of Patent: Apr. 30, 1996

[54] ENERGY ANALYSIS FAULT DETECTION SYSTEM

[75] Inventors: B. Don Russell; B. Michael Aucoin, both of College Station, Tex.

[73] Assignee: The Texas A & M University System

[21] Appl. No.: 138,146

[22] Filed: Oct. 15, 1993

[51] Int. Cl.⁶ .......................... G01R 31/08; G01R 19/00
[52] U.S. Cl. ...................... 324/522; 364/483; 364/492; 361/80
[58] Field of Search ........................................ 324/536, 522

[56] References Cited

U.S. PATENT DOCUMENTS

| | | |
|---|---|---|
| 3,308,345 | 3/1967 | Van Cortlandt Warrington. |
| 3,515,943 | 6/1970 | Van Cortlandt Warrington. |
| 4,281,386 | 7/1981 | Kondow et al.. |
| 4,297,738 | 10/1981 | Lee. |
| 4,313,146 | 1/1982 | Lee. |
| 4,347,542 | 8/1982 | Calhoun. |
| 4,347,738 | 9/1982 | Sanderson. |
| 4,466,071 | 8/1984 | Russell, Jr.. |
| 4,470,092 | 9/1984 | Lombardi. |
| 4,559,491 | 12/1985 | Saha. |
| 4,719,580 | 1/1988 | Nimmersjö. |
| 4,751,653 | 6/1988 | Junk et al.. |
| 4,752,886 | 6/1988 | Gareis. |
| 4,766,549 | 8/1988 | Schweitzer, III et al.. |
| 4,785,406 | 11/1988 | Lunderius et al.. |
| 4,795,983 | 1/1989 | Crockett et al.. |
| 4,800,509 | 1/1989 | Nimmersjö. |
| 4,812,995 | 3/1989 | Girgis et al.. |
| 4,851,782 | 7/1989 | Jeerings et al.. |
| 4,853,175 | 8/1989 | Book, Sr.. |
| 4,855,671 | 8/1989 | Fernandes. |
| 4,864,453 | 9/1989 | Bergman et al.. |
| 4,868,704 | 9/1989 | Cavero. |
| 4,871,971 | 10/1989 | Jeerings et al.. |
| 4,878,142 | 10/1989 | Bergman et al.. |
| 4,991,105 | 2/1991 | Pimental. |
| 5,003,486 | 3/1991 | Hendel. |

OTHER PUBLICATIONS

M. Aucoin, B. D. Russell, "Distribution High Impedance Fault Detection Utilizing High Frequency Current Components," *IEEE Transactions on Power Apparatus and Systems*, vol. PAS–101, No. 6, Jun., 1982, pp. 1596–1606.

M. Aucoin, B. D. Russell, "Detection of Distribution High Impedance Faults Using Burst Noise Signals Near 60 Hz," *IEEE Transactions on Power Delivery*, vol. PWRD–2, No. 2, Apr., 1987, pp. 342–348.

B. D. Russell, B. M. Aucoin, T. J. Talley, "Detection of Arcing Faults on Distribution Feeders," EL–2757, Research Project 1285–3, Final Report, Dec., 1982.

Carl Lee Benner, "An Algorithm for Faulted Phase and Feeder Selection Under High Impedance Fault Conditions," A Thesis Submitted to the Graduate College of Texas A&M University, Aug., 1988.

Patrick Wayne Carswell, "The Detection of High Impedance Faults Using Random Fault Behavior," A Thesis Submitted to the Graduate College of Texas A&M University, Aug., 1988.

C. Benner, P. Carswell, B. D. Russell, "Improved Algorithm for Detecting Arcing Faults Using Random Fault Behavior," *Electric Power Systems Research*, vol. 17, 1989, pp. 49–56.

Expert System for Detecting High Impedance Faults, U.S. patent application Ser. No. 08/138,392, filed Oct. 15, 1993, invented by Russell.

Arc Spectral Analysis System, U.S. patent application Ser. No. 08/138,489, filed Oct. 15, 1993, invented by Russell et al.

Load Analysis System for Fault Detection, U.S. patent application Ser. No. 08/138,144, filed Oct. 15, 1993, invented by Russell et al.

Load Extraction Fault Detection System, U.S. patent application Ser. No. 08/138,413, filed Oct. 15, 1993, invented by Russell et al.

Randomness Fault Detection System, U.S. patent application Ser. No. 08/138,410, filed Oct. 15, 1993, invented by Russell et al.

Arc Burst Pattern Analysis Fault Detection System, U.S. application Ser. No. 08/138,477, filed Oct. 15, 1993, by Russell et al.

"Detection of High Impedance Faults," EPRI Report, EL–2413, Prepared by Power Technologies, Inc., Jun. 1982.

"High Impedance Fault Detection Using Third Harmonic Current," EPRI Report, EL–2430, Prepared by Hughes Aircraft Company, Jun. 1982.

"The Characterization of High Impedance Faults," Prepared by PowerTech Labs, Inc., Canadian Electrical Association, Project 038 D 721, Jun. 1992.

*Primary Examiner*—Maura K. Regan
*Attorney, Agent, or Firm*—Flehr, Hohbach, Test, Albritton & Herbert

[57] ABSTRACT

A method and apparatus are provided for detecting an arcing fault on a power line carrying a load current. The apparatus monitors and analyzes energy values of the load current flowing through the line. The analyzed energy values are compared to several threshold values. The number of energy values being greater than the threshold values are compiled to determine whether an arcing fault exists on the power line.

5 Claims, 10 Drawing Sheets

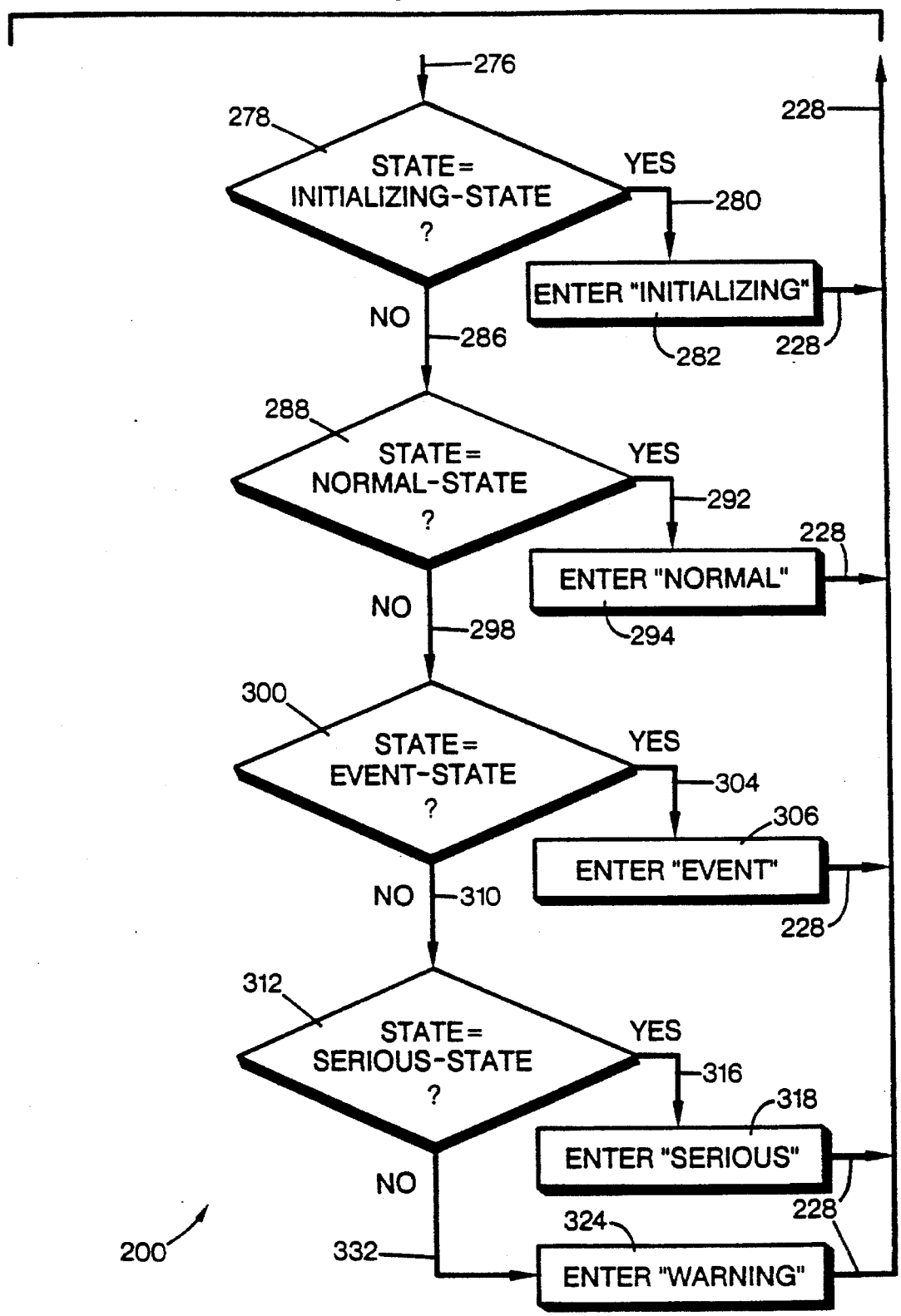

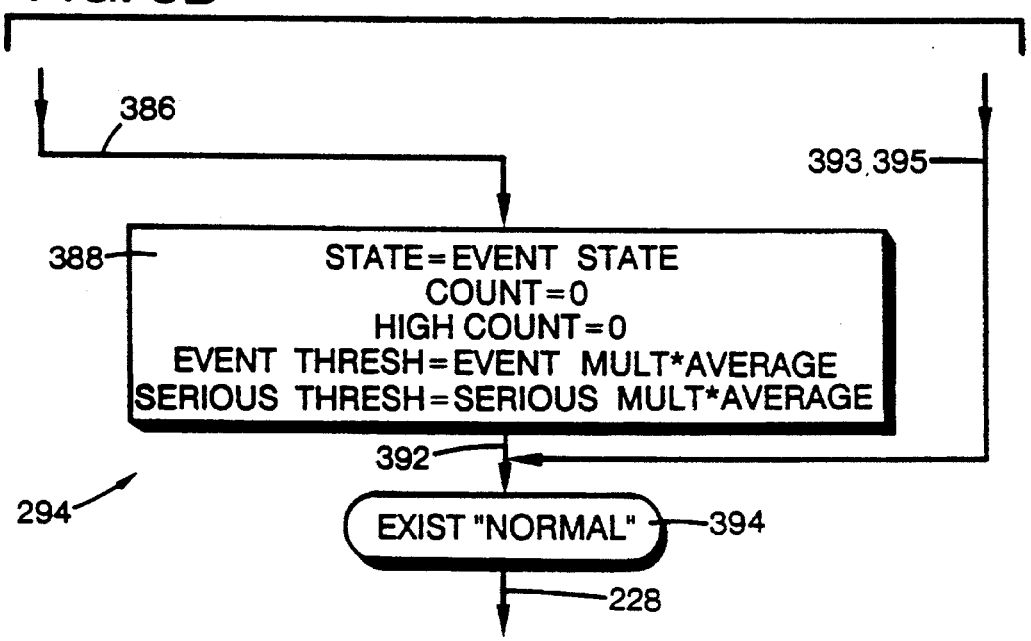

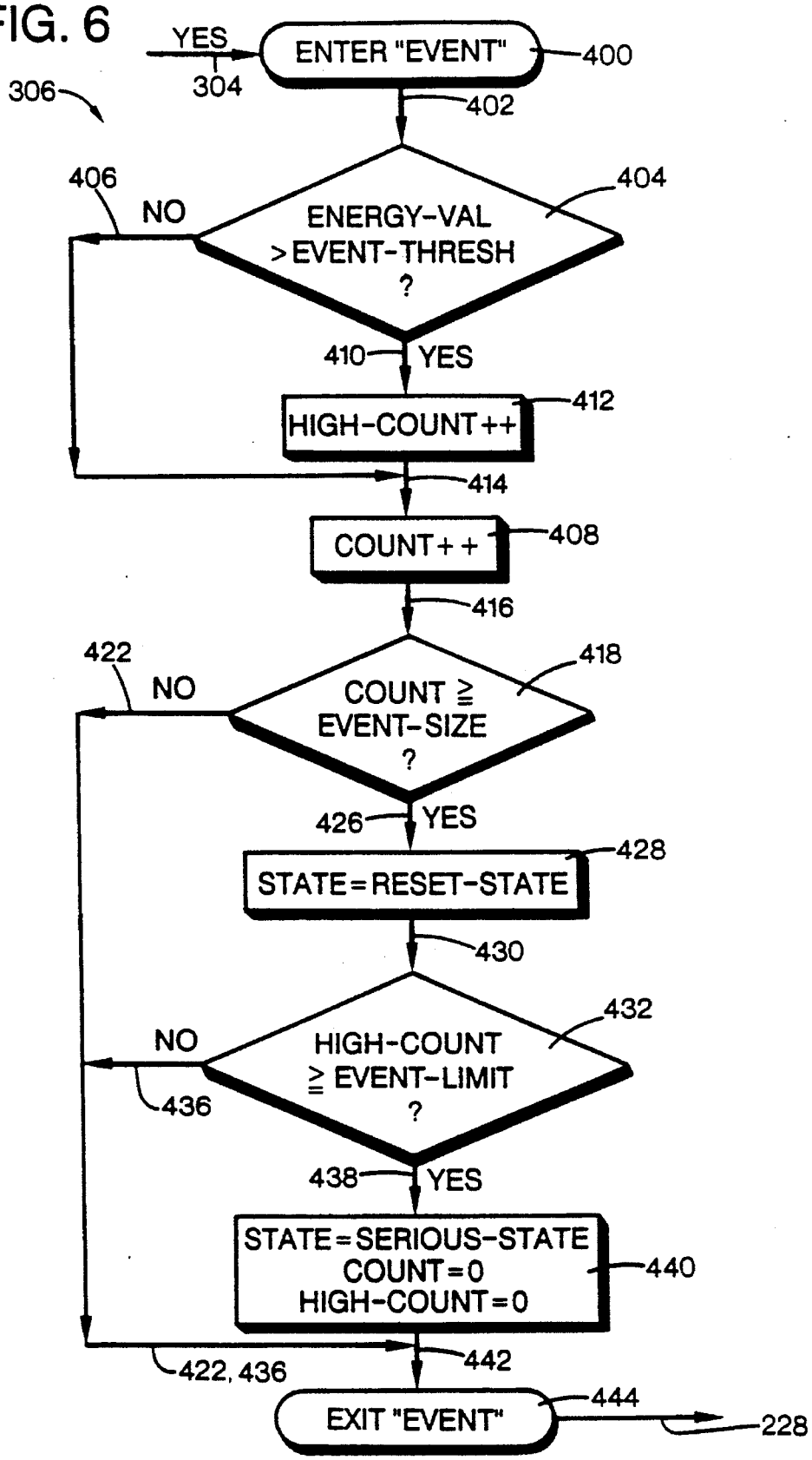

ENERGY ANALYSIS FAULT DETECTION SYSTEM

BACKGROUND OF THE INVENTION

The present invention relates generally to an analysis system for use with an electric utility power system, and more particularly to an energy analysis fault detection system for detecting high impedance, low current arcing faults on the power system. Arcing faults may be caused by, for example, downed, broken, tangled or dangling power lines, trees contacting the power lines, and various overcurrent fault situations. Typically, such arcing faults are rich in non-fundamental frequency components.

Arcing faults are more difficult to detect than permanent overcurrent faults, which for instance, occur when a transformer fails. Most conventional overcurrent protection devices, such as fuses, recloser, relays and the like, have time delays which prevent a temporary fault from de-energizing the power line. Only if the overcurrent fault persists does such a protection device de-energize the power line. Some arcing faults may initialize the timing circuits of the overcurrent protection devices but, by the end of the time delay, the high impedance nature of the fault limits the fault current to a low value. Such overcurrent protection devices cannot distinguish this low fault current from the levels of current ordinarily drawn by customers; hence, the line may remain energized even though a dangerous arcing fault exists on the power line.

Other methods of detecting arcing faults have focused on the harmonic frequency content of the line current. These earlier methods compared the magnitude of line current harmonics with a predetermined reference magnitude. For instance, U.S. Pat. No. 3,308,345 to Warrington detects arcing faults by first filtering out the fundamental frequency (e.g. 60 Hertz in the United States and 50 Hertz in Europe) and its second and third harmonics. The magnitude of the remaining high harmonic frequencies, i.e., the fourth, fifth . . . harmonic frequencies, are then compared to a predetermined threshold magnitude value. Warrington measures the signals over a predetermined length of time in one frequency range. If the magnitude value of the high harmonic frequency components exceeds the reference magnitude value, the Warrington device produces a warning signal.

However, arcing often exhibits highly variable instantaneous magnitudes in many frequency ranges over time, particularly at nonharmonic frequencies near the fundamental frequency. The earlier methods concentrated only on selected high harmonic frequencies, and ignored the remainder of the frequency spectrum. These earlier methods simply failed to analyze a wide range of frequencies. Also, if the reference magnitude values were set too low, the earlier detection systems would often be too sensitive. As a result, a power line would be de-energized even though no hazardous fault existed on the line. Similarly, if the reference magnitude values were set too high or the arcing did not last long enough, the line would remain energized even though a dangerous fault existed on the power line.

Thus, a need exists for an improved high impedance energy fault detection system for electrical power transmission and distribution systems which is directed toward overcoming, and not susceptible to, these limitations and disadvantages.

SUMMARY OF THE INVENTION

The present invention encompasses an energy detection system for detecting and determining the type of fault that exists on a power line by analyzing energy values of a load current flowing through the line. Advantageously, this approach minimizes unnecessary power service interruptions and outages.

According to one aspect of the present invention, a method is provided for analyzing arcing faults occurring on a power line, such as a transmission line or a distribution line. The power line delivers power from an AC power generation system to customers, often through one or more substations. The preferred method comprises the step of providing several threshold energy values which represent various conditions on the power line, such as normal, minor and major events. In a monitoring step, the system monitors the load current flowing through the power line. In an analyzing step, the energy values of the load current are calculated from the monitored line current. The energy values are then compared to the selected threshold values, while counters compile the number of energy values being greater than the threshold energy values. In a determining step, the system determines, based on the number of energy values compiled by the counters, whether a dangerous arcing fault exists on the power line.

An overall object of the present invention is to provide an energy detection system for detecting arcing faults that are too small to be properly recognized by conventional overcurrent protection systems.

Another object of the present invention is to provide an energy detection system which is faster, more economical and more reliable than the earlier systems.

The present invention relates to the above features and objects individually as well as collectively. These and other objects, features and advantages of the present invention will become apparent to those skilled in the art from the following description and drawings.

BRIEF DESCRIPTION OF THE DRAWINGS

FIGS. 2A and 2B are an overview flow chart of one manner of operating the energy detection system of FIG. 1.

FIGS. 5A and 5B are adjoining portions of a flow chart illustrating one form of a normal subroutine of FIG. 2B.

FIG. 6 is a flow chart illustrating one form of an event subroutine of FIG. 2B.

DETAILED DESCRIPTION OF A PREFERRED EMBODIMENT

Figure 1:
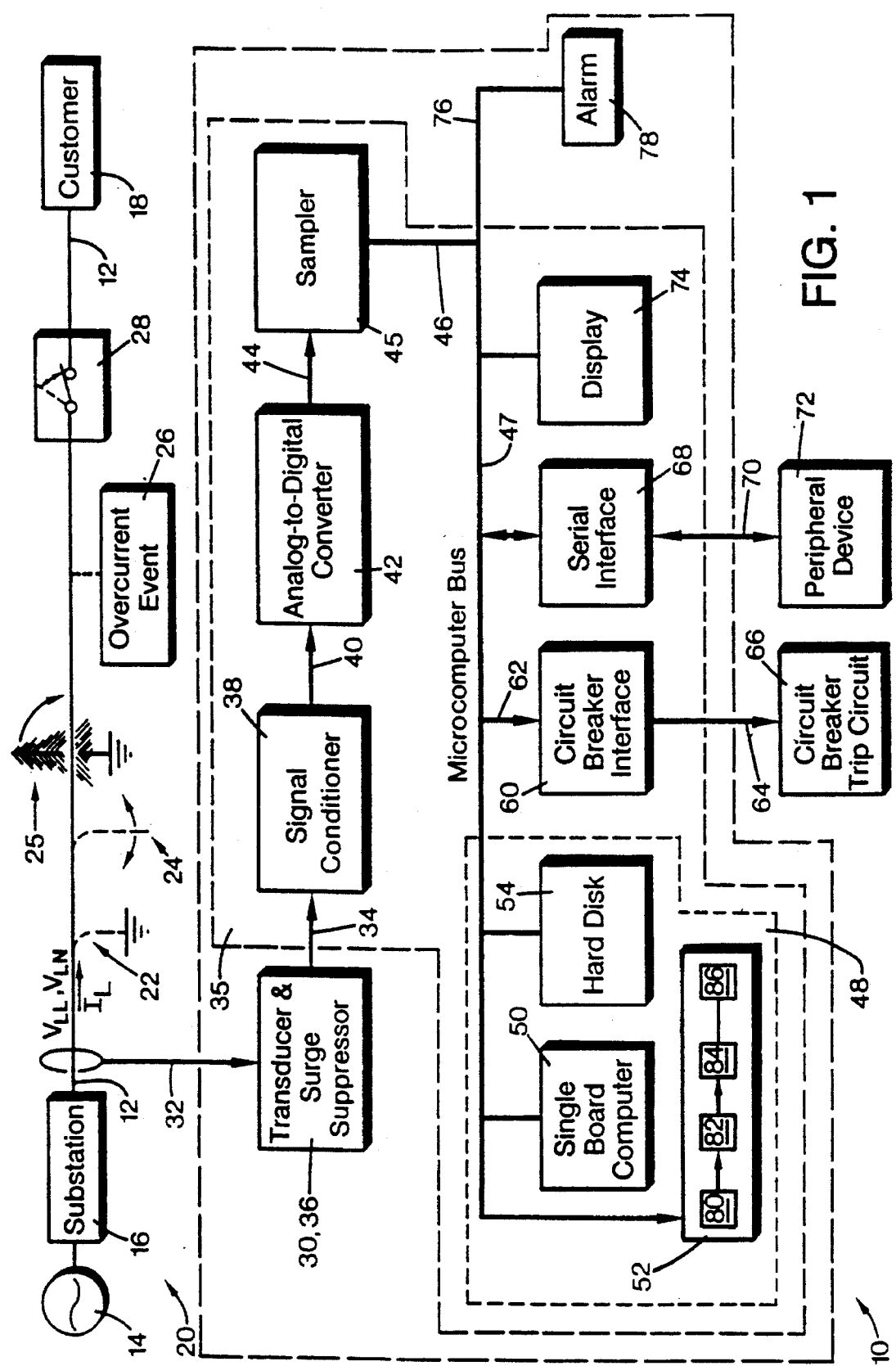
FIG. 1 is a schematic block diagram of one form of an energy detection system of the present invention.

Referring to FIG. 1, an energy analysis fault detection system or detector 10 constructed in accordance with the present invention is shown coupled to detect faults, such as high impedance, low current, arcing faults on a feeder line 12. The energy analysis fault detector 10 may be operated alone, or as a portion of a higher level fault analysis scheme, such as the one disclosed in one of the coinventors' other concurrently filed patent applications, entitled, "Expert System," U.S. patent application Ser. No. 08/138,392, filed Oct. 15, 1993.

The feeder line 12 receives power from an AC power source, such as a generating station 14, through a substation 16. Other feeder lines (not shown) may also receive power from the generating station 14 and exit the substation 16. The feeder line 12 delivers power from the substation 16 to a variety of utility customers, such as customer 18.

Altogether, the generating station 14, the substation 16, and feeder line 12 illustrate a portion of an electrical utility's power system 20. Most typical power systems generate and distribute power using a three phase system. Thus, the feeder line 12 may deliver power over three phase lines, known as phases A, B, and C. The feeder line 12 may also have a neutral conductor. For convenience, power system 20 illustrated herein is such a three phase system.

Between the substation 16 and the customer 18, the feeder line 12 may be subjected to a variety of different types of events, activities and faults. Some typical faults are illustrated in FIG. 1, specifically, an arcing fault caused by a downed conductor 22, a dangling conductor 24, or momentary contact of a tree 25 or other object with the feeder line 12. The system may also be subject to other disrupting events, such as an overcurrent event 26, and a switching event 28 performed by a conventional reclosure or the like.

The detector 10 includes a monitoring device, such as a sensor or transducer 30, coupled to feeder line 12 as indicated schematically by line 32. The term "monitoring device" is broadly defined herein to include sensing devices, detecting devices, and any other structurally equivalent device or system understood to be interchangeable therewith by those skilled in the art. The illustrated transducer 30 senses or monitors a line parameter, such as line voltage (line-to-line $V_{LL}$ or line-to-neutral $V_{LN}$), or load current $I_L$ flowing through feeder line 12.

For instance, in response to monitoring the load current $I_L$, the transducer 30 produces a line parameter signal, here, a load current signal 34, from which the fault components of the parameter be determined. The transducer 30 may be a conventional transducer or an equivalent device, such as a multiple phase current measuring device typically having one current transformer per phase, plus one on the neutral conductor, of the feeder line 12. If instead voltage is the selected parameter of monitoring, there are a variety of commercially available voltage transducers known to those skilled in the art that would be suitable. Of course, both voltage and current could be monitored if desired. It is also conceivable that other parameters of the line current may be measured, for instance, power, with suitable transducers selected to accomplish the desired monitoring.

The detector 10 may also include surge protection, for example, a surge suppressor or protector 36. The surge protector 36 may be supplied either with the transducer 30, as illustrated, or as a separate component. The surge protector 36 protects the detector 10 from power surges on the feeder line 12, such as those caused by lightning strikes or the like.

A controller 35 receives the load current signal 34 from transducer 30. The controller 35 may include a signal conditioner 38 for filtering and amplifying the load current signal 34 to provide a clean conditioned load current signal 40. Preferably, the signal conditioner 38 includes a low-pass filter suitable for satisfying the Nyquist criteria of sampling, known to those skilled in the art.

The signal conditioner 38 may also amplify the load current signal 34 for the appropriate gain required by an analog-to-digital (A/D) converter 42. For example, the current flowing on the power system 20 may have a dynamic range of 10 to 10,000 Amps, so the signal conditioner 38 appropriately scales these signals for conversion by the A/D converter 42 from an analog signal 40 into a digital load current signal 44.

When the transducer 30 is an analog device, the controller 35 includes the illustrated discrete A/D converter 42. The transducer 30 may also be implemented as a digital device which incorporates the signal conditioning function of conditioner 38 and the analog-to-digital conversion function of the A/D converter 42.

Additionally, the controller 35 may include a power parameter sampling device or sampler 45. The illustrated sampler 45 samples the digitized current signal 44 at selected intervals to provide an accurate representation of the load level due to rapidly changing conditions, such as during arcing faults.

In the illustrated embodiment, the sampler 45 provides a sampler signal 46 corresponding to the sampled line parameter values, such as line current $I_L$ or voltage (line-to-line $V_{LL}$ or line-to-neutral $V_{LN}$). The sampler signal 46 is supplied via a microcomputer bus 47 to a computing device, such as a microcomputer system 48. The illustrated microcomputer system 48 has a computer, which may be a single-board computer 50, coupled with a memory device, for instance, a random-access memory 52, and a data storage device, such as a hard disk 54. A suitable microcomputer system 48 may include a conventional personal computer or any other equivalent device known to be interchangeable by those skilled in the art.

The sampler 45 may measure the line parameter values on a time-domain basis, or the sampling function may be conducted by microcomputer system 48. For instance, the sampler 45 may measure the energy values of the line current $I_L$ over a time period ranging from less than a half a second to several seconds. Other details of the sampling process are described below. It is apparent to those skilled in the art that other variations of these sensing and sampling functions are also possible. For instance, line-to-line voltages $V_{LL}$ or line-to-neutral voltages $V_{LN}$ may be monitored, sampled and analyzed instead of, or in addition to, monitoring of the line current $I_L$.

The controller 35 has a circuit breaker interface 60 for receiving a trip command signal 62 from the computer 50 via bus 47. In response to the trip command signal 62, the interface 60 sends a trip signal 64 to a circuit breaker trip circuit 66. The trip circuit 66 drives a circuit breaker (not shown) located at substation 16 to de-energize ("trip") feeder line 12.

The controller 35 may also include an optional serial interface 68, such as a modem for sending and receiving a peripheral device signal 70 over a telephone network. The interface 68 may communicate with an external peripheral device 72, such as a remotely located power distribution control center. In some systems, the peripheral device 72 may provide a remote input to the detector 10 via serial interface 68, for example, to override previous programming of the detector 10, such as initial settings, sampling rates, a sampling time period, and the like.

Controller 35 may also include an output device, such as a visual display device 74, or a printer. Preferably, the output display 74 provides a visual indication of the status of detector 10, feeder line 12, and the previous operating conditions of the feeder line. The controller 35 may also provide an alarm signal 76 via bus 47 to an alarm 78, which may be visual, audible, or both.

In the utility industry, it is generally accepted that power distribution involving voltage levels below 25 kV are problematic in the area of high impedance fault detection. The problems associated with this detection are due in part because at this voltage, the arc impedance is relatively high, and therefore, fault current is low. Furthermore, the mechanics of the fault are such that steady arcs are typically not sustained. Thus, the arcing stops before fuses are able to blow and before overcurrent protection devices are able to operate. Of course, this same difficulty may also be encountered in distribution systems operating at voltage levels of 25 kV and above.

Typically, the fault current magnitude of a high impedance fault on the power system 20 is dependant upon the various environmental conditions at the fault site. For example, the current magnitude will fluctuate as the resistance of the current path changes due to the presence of ionized gases, soil particles and the like in the current path, as well as the type of grounding surface in contact with the live conductor. Thus, the fault current magnitude is simply not related the voltage or current levels of the line, nor to the rated capacities of the distribution system.

Operation

Figure 2A:
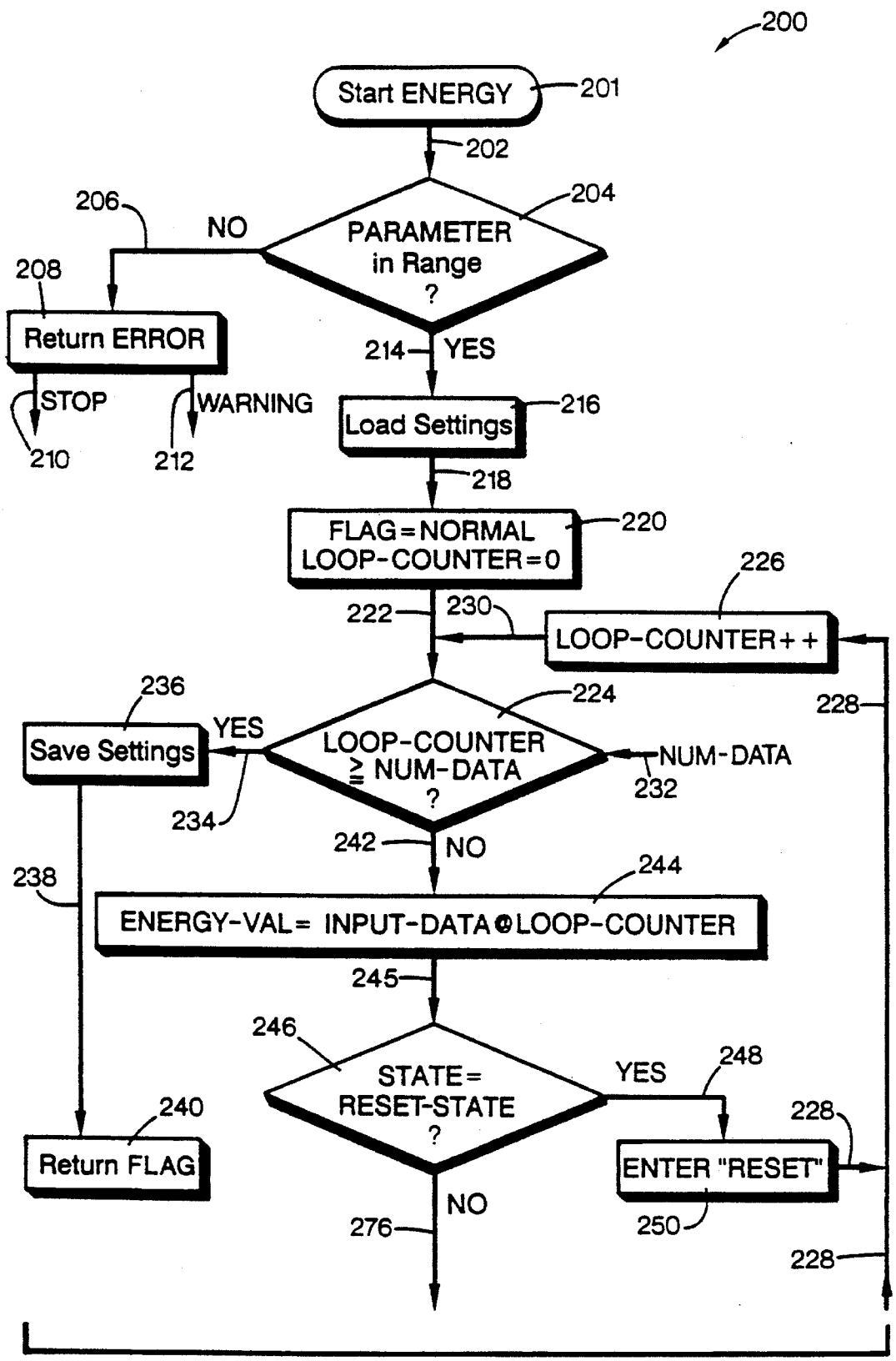

Referring also to FIGS. 2A and 2B (hereinafter collectively referred to as "FIG. 2"), a flow chart 200 illustrates one method of the detecting faults in accordance with the present invention, using detector 10 of FIG. 1. This method is schematically illustrated in flow chart 200 as a series of steps or portions. A portion is defined broadly herein as a component for performing a processing step, as well as a step portion of the illustrated process, which may be implemented by hardware, software or combinations thereof known to those skilled in the art.

Since downed conductor arcing faults 24 typically produce a current that is rich in non-fundamental frequency components, the detector 10 looks for this resulting increase in the level of non-fundamental frequency components. By monitoring the ambient level of energy contained in a particular frequency component, the detector looks for a sudden and sustained change in this energy level. If the energy signal displays these characteristics of arcing, the detector issues a signal indicating its belief that a high impedance, low current, arcing fault has occurred.

In the preferred embodiment, multiple energy samples, derived from conditions on the line 12 are accumulated, and periodically the operations of flow chart 200 are executed, rather than being executed each time an energy level is sampled. The measured data associated with each group of energy samples are stored in a buffer matrix arrangement, with an integer indicator for pointer, referred to herein as a PARAMETER pointer, being sequentially moved from sample to sample within the matrix.

Referring back to FIG. 1, in general, the energy sample values are preferably, but not necessarily, assembled as a collection of data, which is stored in selected buffers or "windows," such as one of buffers 80, 82 and 84 of RAM 52. In the illustrated embodiment, the data window 80 serves as an input data buffer, and receives the data first from the sampler 45. The sampler 45 preferably provides the energy values to buffer 80 by issuing the sampler signal 46 thereto. The buffers 82 and 84 may serve as intermediate or output buffers, and may receive a selected portion of the data from buffer 80. The RAM 52 may include more buffers than the illustrated buffers 80, 82, 84, or these buffers may be able to accommodate multiple data arrays. As described further below, selected portions of the data in buffer 80 may be eventually passed on to other buffers 82, 84. The RAM 52 also has a counter buffer 86 which provides plural counting functions in response to incrementing signals, and zero resetting signals.

The input buffer 80 stores the energy values, referred to herein as "INPUT-DATA," and which are periodically accessed using a dynamic INPUT-DATA pointer, and then operated upon in subsequent operations as illustrated in flow chart 200. A pointer may be a static pointer or a dynamic pointer. A static pointer may identify the same specific location, such as the beginning and ending locations of a data stream or a portion of a data stream. A dynamic pointer may move through a data stream, such as between locations established by static pointers, in response to the operations below to select various data for subsequent processing steps.

In general, the illustrated fault detection process begins at a "start ENERGY" portion 201 which issues a starting signal 202 in response to a start command signal (not shown) from an operator, microcomputer system 48 or an equivalent device as known to those skilled in the art. A parameter range comparison portion or first comparator 204 receives a starting signal 202 and selects a parameter value, referred to herein as "PARAMETER," based on the type of energy values stored in the input buffer 80. For example, these energy values may be the magnitudes of individual current frequency components or groups of such components, with the operations described below being performed on each type of value simultaneously or sequentially.

PARAMETER may be an indicator integer value that is associated with a group of predetermined settings and buffers. A "setting" is preferably defined as a single value, but it may also represent a set of values. The buffers described herein store data which may be defined as an array or vector of values. For example, different parameter settings may be used depending upon whether the energy samples stored in the input buffer 80 represent current or voltage values. Also, the parameter setting selected may depend upon which phase and/or frequency ranges are stored in buffer 80. In the illustrated embodiment, the value of a setting or buffer for one parameter value is not particularly related to the setting or buffer of the other parameters. However, in an alternative embodiment, the setting and buffer for one parameter may be associated with those of one or more of the other parameters.

The parameter range comparator 204 determines whether the PARAMETER variable is within a selected allowable range. If the settings for PARAMETER associated with a particular type of energy value, such as current or voltage values, are substantially higher or lower than the settings used in a prior analysis of the same type of energy values, then the parameter range comparator 204 determines that the parameter settings are beyond the allowable range. For instance, if the parameter settings are 50% higher than the previously used parameter settings for the same type of energy values, then parameter portion 204 may issue a NO signal 206 to a return error portion 208.

Upon receiving the NO signal 206, indicating that the parameter settings are out of range, the error portion 208 preferably generates a stop signal 210 to stop all further processing by microcomputer system 48. Optionally, the error portion 208 may send a warning signal 212 to the peripheral device 72, display unit 74, and/or alarm 78.

If PARAMETER is within the allowable range, the parameter range comparator 204 issues a YES signal 214 to a load setting portion 216. In the preferred embodiment, the settings and buffers associated with the selected PARAMETER are loaded and stored as temporary variables in microcomputer 48, although they may be stored in other locations, such as on hard disk 54, RAM 52 or other equivalent locations known to those skilled in the art. Thus, buffer 80 may have several segments for storing different types of data streams, such as line-to-line or line-to-neutral voltages, line currents, etc. If remotely stored, these temporary variables may be retrieved and loaded into microcomputer system 48 for processing. Temporary variables are preferred because they are generally more efficient for computer processing than are permanent variables.

When the loading of the temporary variables is completed, the load setting portion 216 issues a set signal 218 to an flag setting portion 220. Upon receiving signal 218, the flag setting portion 220 sets a FLAG indicator to a normal indication status, and positions a dynamic LOOP-COUNTER pointer to the beginning of input buffer 80. The FLAG indicator may be used to indicate the general condition of detector 10 to a function of microcomputer system 48 or to another independent system.

For example, FLAG may be an output indicator to a system level function of detector 10 which invokes the calculations performed by microcomputer system 48 at starting portion 201. Additionally, FLAG may be used to indicate whether the line 12 has been subjected to an EVENT justifying the de-energizing of a portion of the power line or whether the line is in a normal condition requiring no action. The default value for the FLAG indicator is NORMAL, and a normal signal (not shown) may optionally be sent to device 72 and/or display 74 when FLAG is set to NORMAL.

LOOP-COUNTER 226 is a dynamic pointer which may be moved, in a step-by-step fashion, to point at each memory location in input buffer 80. When the FLAG indicator is set, and the LOOP-COUNTER pointer is positioned at the beginning of input buffer 80, setting portion 220 issues a set signal 222 to a second comparing portion or comparator 224. To repeat the operational steps described below for each value stored in the input buffer 80, the value of the LOOP-COUNTER pointer is increased by one (LOOP-COUNTER +1) by an incrementing portion or incrementor in response to a next value signal 228. The incremented value of the LOOP-COUNTER pointer is supplied as a next location signal 230 to comparator 224. Initially, the value of signal 230 is zero, so on the initial iteration, comparator 224 uses the value of signal 222, then on subsequent iterations, comparator 224 uses the newly incremented signal 230.

In general, comparing portion 224 determines whether any unused energy values remain in input buffer 80 by comparing the LOOP-COUNTER pointer position, represented by signal 222 initially, and later by signal 230, to a NUM-DATA value signal 232. The NUM-DATA signal 232 represents the number of valid energy values stored in buffer 80.

If the LOOP-COUNTER value is greater than or equal to the NUM-DATA value (LOOP-COUNTER ≧ NUM-DATA), then no data remain in buffer 80 and comparator 224 issues a YES signal 234. In response to signal 234, a save settings memory portion 236 saves the local variables, specifically, the variables AVE-PTR, AVE-BUFF-SIZE, AVERAGE, DIST-MULT, COUNT, HIGH-COUNT, EVENT-THRESH, EVENT-MULT, SERIOUS-THRESH, SERIOUS-MULT, SERIOUS-LIMIT, EVENT-LIMIT, SERIOUS-SIZE, and EVENT-SIZE. The stored parameter settings may be used the next time energy values associated with the particular PARAMETER are monitored. In response to save signal 234, memory portion 236 may send a return signal 238 to a flag portion 240, which returns a FLAG indicator to a system level function portion of detector 10 to indicate that the analysis of the energy values stored in buffer 80 is complete.

If the value of LOOP-COUNTER is less than the value of NUM-DATA (LOOP-COUNTER<NUM-DATA), i.e. more energy values remain in buffer 80 for analysis, then the comparator 224 sends a NO signal 242 to a loading portion or loader 244. The loader 244 loads buffer 82, referred to herein as energy buffer 82, one memory location per iteration, by setting the value of ENERGY-VAL equal to the magnitude value stored at the memory location in input buffer 80 indicated by the LOOP-COUNTER pointer. In other words, the remaining energy values stored in input data buffer 80 are loaded into the ENERGY-VAL buffer 82 as LOOP-COUNTER pointer is incremented through the input buffer 80. Upon completion of the loading, the loader 244 issues a loaded signal 245 to a reset state comparing portion or comparator 246.

In general, the comparator 246 determines a present STATE of detector 10 which has for instance, five possible values:

1) RESET-STATE,

2) INITIALIZING-STATE,

3) NORMAL-STATE,

4) EVENT-STATE, or

5) SERIOUS-STATE.

STATE may be an integer value which indicates the state or condition of line 12 based on the energy values stored in buffer 80. The value of STATE is preferably, but not necessarily, a predetermined value. The default setting for STATE is preferably a RESET-STATE. Thus, in response to signal 245, comparator 246 compares the value of STATE to a RESET-STATE value. For example, the RESET-STATE value is preferably a fixed numerical value in the computer which represents the state. If the value of STATE equals RESET-STATE (STATE=RESET-STATE) then comparator 246 issues a YES reset signal 248 to trigger a RESET subroutine 250.

Figure 3:
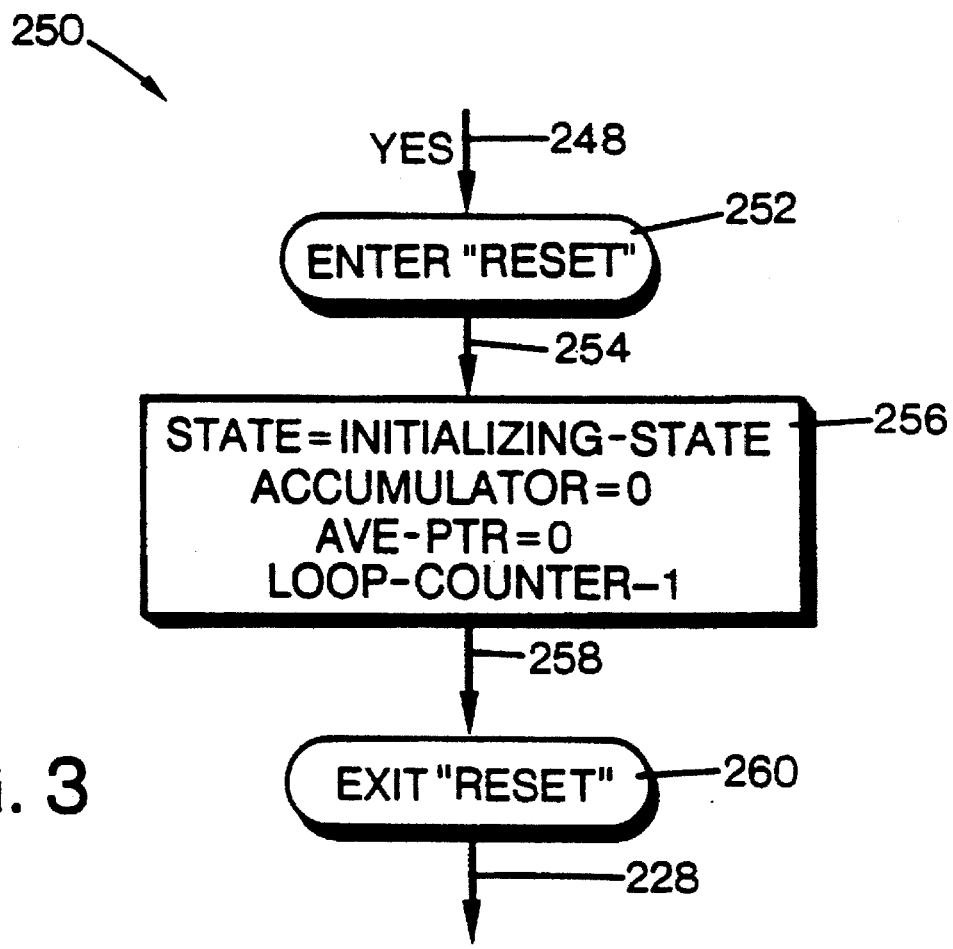
FIG. 3 is a flow chart illustrating one form of a reset subroutine of FIG. 2A.

Referring to FIG. 3, the RESET subroutine 250 includes an entrance portion 328 which receives YES signal 248 from comparator 246. In response to the signal 248, the entrance portion 252 sends a reset signal 254 to a resetting portion 256 which in turn sets STATE to INITIALIZING-STATE. The detector 10 also includes an AVE-BUFF buffer which maintains energy values received from the ENERGY-VAL buffer. The AVE-BUFF buffer may be stored in a portion of buffer 84. New energy values go into ENERGY-VAL and into AVE-BUFF buffers if ENERGY-VAL does not exceed DIST-THRESH while in the NORMAL state (see comparator 384). The total number of values capable of being stored in the AVE-BUFF buffer is indicated by value assigned to AVE-BUFF-SIZE.

The resetting portion 256 also sets an ACCUMULATOR counter portion of counter 86 to an initial value of zero. The ACCUMULATOR counter value represents the sum of all the energy values stored in the memory positions defined by an integer or indicator AVE-BUFF-SIZE of a buffer AVE-BUFF. AVE-BUFF-SIZE indicates the total number of valid memory positions available in AVE-BUFF. The AVE-BUFF buffer uses the energy values received from ENERGY-VAL for updating the value of ACCUMULATOR.

Upon receiving set signal 254, resetting portion 256 resets or moves an AVE-PTR pointer to the beginning of AVE-BUFF buffer (AVE-PTR=0). The resetting portion 256 decrements or moves LOOP-COUNTER back one memory position within input buffer 80 (LOOP-COUNTER −1). The reason for moving LOOP-COUNTER forward is explained below. Upon completion of resetting these values, the resetting portion 256 issues an exit signal 258 to an exit portion 260. In response to exit signal 334, exit portion 260 issues the increment signal 228 (FIG. 2A) to an incrementing portion 226 to increment or move the LOOP-COUNTER pointer one memory position forward, and comparator 224 continues with the next iteration as described above.

If the RESET-STATE comparator 246 finds STATE not equal to RESET-STATE, the comparator 246 issues a NO signal 276 to an INITIALIZING-STATE comparing portion or comparator 278 (FIG. 2B). The NO signal 276 will be issued whenever STATE has been previously set to INITIALIZING-STATE by the re setting portion 256 (see FIG. 3). The comparator 278 compares the value of STATE to that of INITIALIZING-STATE. The value of INITIALIZING-STATE is preferably a fixed value stored within in the computer 48 which represents the state. When these values are equal (STATE=INITIALIZING-STATE) comparator 278 issues a YES signal 280 to trigger an INITIALIZING subroutine 282.

Figure 4:
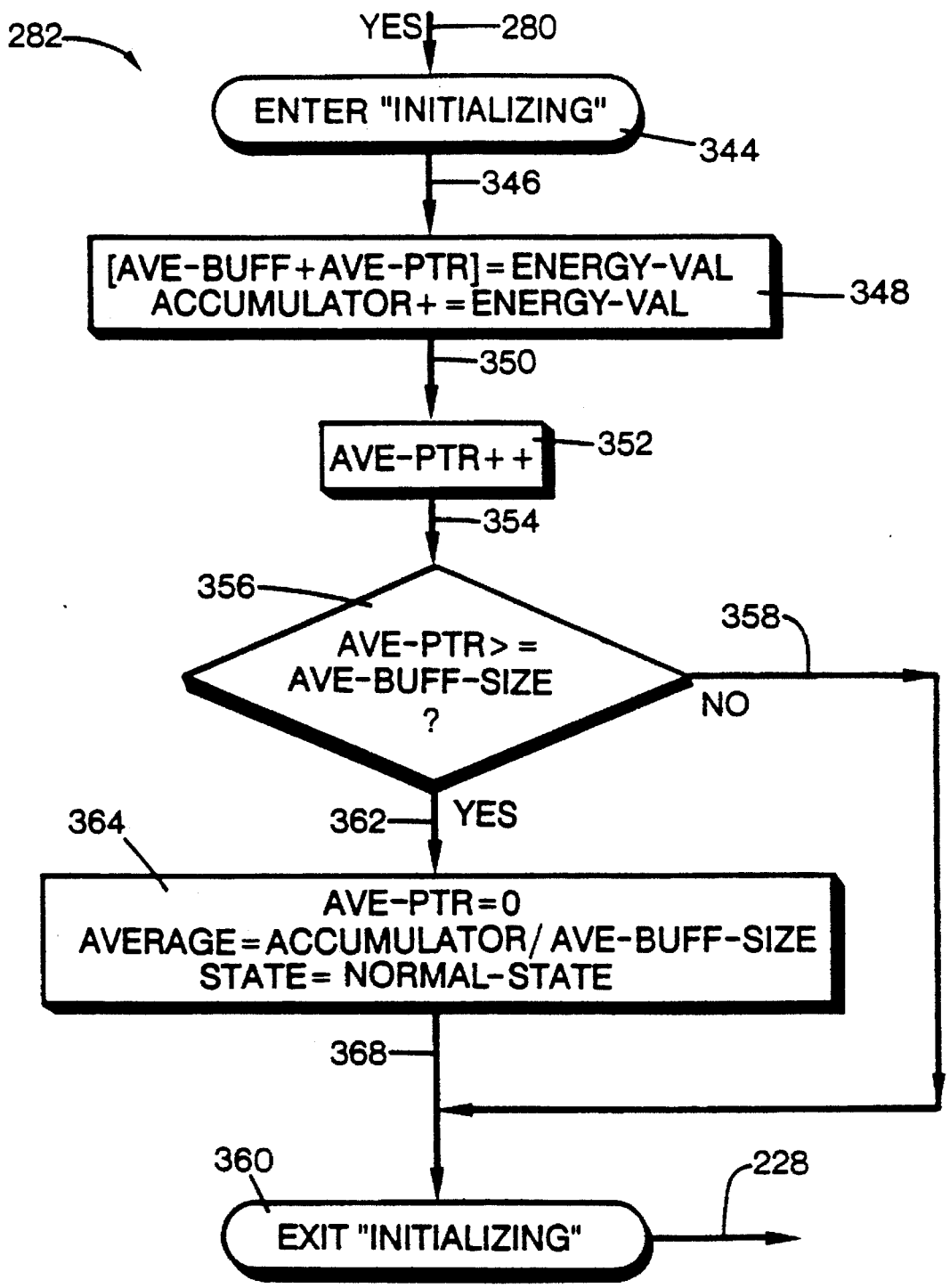
FIG. 4 is a flow chart illustrating one form of an initializing subroutine of FIG. 2B.

Referring to FIG. 4, the INITIALIZING subroutine 282 has an entrance portion 344 which receives the YES signal 280 (FIG. 2B) from comparator 278, and in response thereto, sends a set signal 346 to a setting portion 348. The setting portion loads ENERGY-VAL to into a memory position pointed to by a dynamic pointer AVE-PTR in AVE-BUFF. Thus, the energy value stored in ENERGY-VAL is loaded into a memory position at the beginning of buffer AVE-BUFF since AVE-PTR was set to 0 by setting portion 332 in FIG. 3.

Additionally, setting portion 348 adds the energy value to ACCUMULATOR. Setting portion 348 then issues an increment signal 350 to an incrementing portion 352 to increment or move forward pointer AVE-PTR to point at the next memory position within buffer AVE-BUFF. When AVE-PTR is moved to point at the next memory location, incrementing portion 352 issues a compare signal 354 to a comparing portion 356 which compares the position of pointer AVE-PTR with AVE-BUFF-SIZE.

If AVE-PTR is less than AVE-BUFF-SIZE, i.e. AVE-PTR points at a memory location within AVE-BUFF, then comparing portion 356 sends a NO set signal 358 to an exit portion 360. If AVE-PTR is equal to or greater than AVE-BUFF-SIZE, i.e AVE-PTR points at the last memory location or at a memory location outside AVE-BUFF, then comparing portion 356 sends a YES set signal 362 to a setting portion 364 because all the valid memory positions within AVE-BUFF have been used.

In response to set signal 362, setting portion 364 moves pointer AVE-PTR back to the beginning of AVE-BUFF and an AVERAGE is calculated by setting AVERAGE to equal the value of ACCUMULATOR divided by AVE-BUFF-SIZE known to those skilled in the art. Setting portion 364 also sets STATE to NORMAL-STATE and issues an exit signal 368 to exit portion 360. In response to exit signals 358 and 368, exit portion 360 sends increment signal 228 (FIG. 2B) to incrementing portion 226 (FIG. 2A) to increment the LOOP-COUNTER pointer as described above, to continue the next iteration.

Comparing portions 246 and 278 issue NO signals 276 and 286, respectively, because STATE was set to NORMAL-STATE by setting portion 364 (FIG. 3). In response to NO signal 286, the comparator 288 (FIG. 2B) issues a YES signal 292 because the values of STATE and NORMAL-STATE are equal. The YES signal 292 triggers a NORMAL subroutine 294.

Figure 5A:
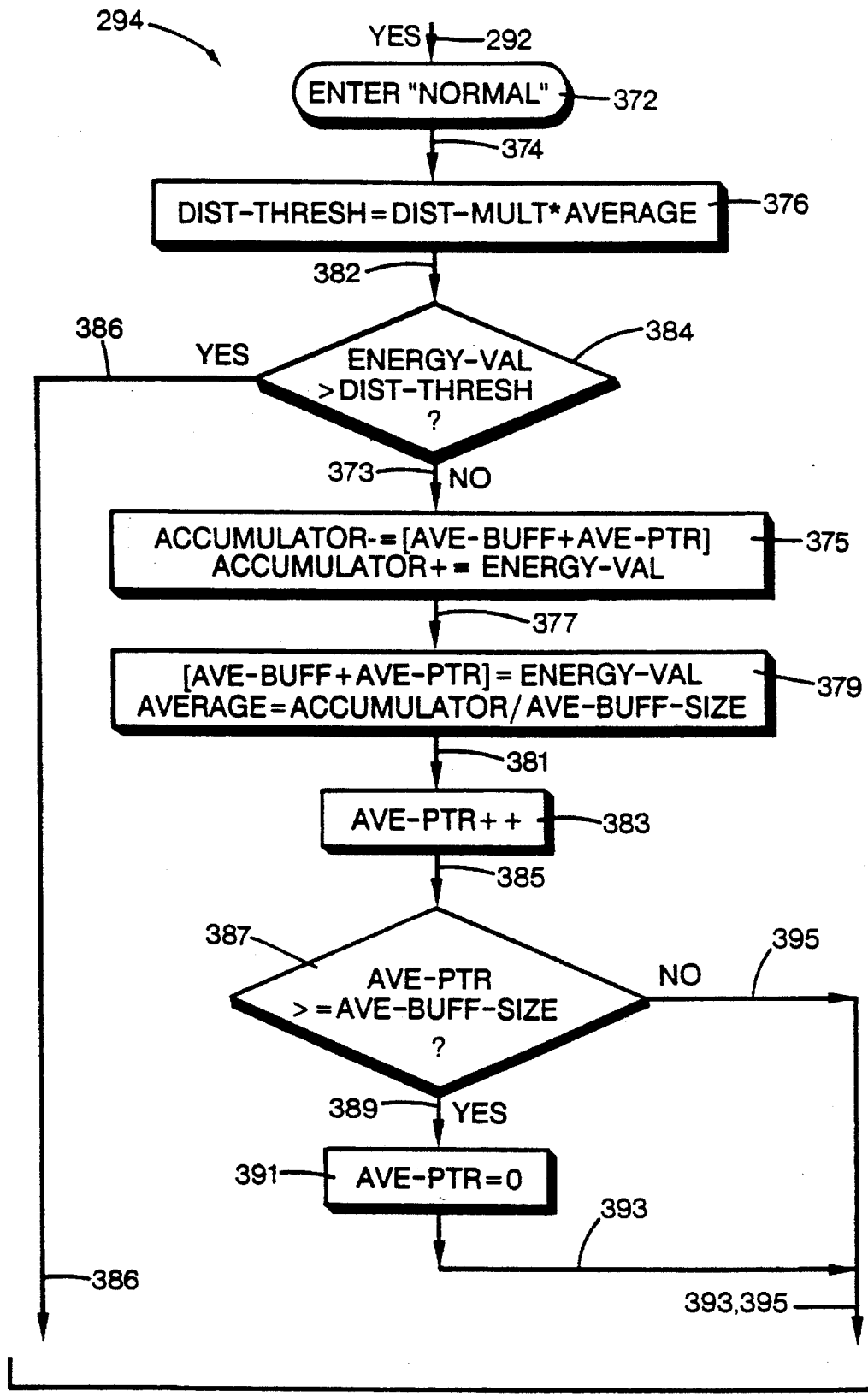

FIGS. 5A and 5B describe the NORMAL subroutine 294 in detail. An entrance or entering portion 372 receives normal signal 292 from comparing portion 288 (FIG. 2B) and in response thereto issues a set signal 374 to a setting portion 376. The setting portion 376 sets a threshold value DIST-THRESH to equal the product of a floating point multiplier DIST-MULT multiplied by the value of AVERAGE. DIST-THRESH represents the highest magnitude value an energy value stored in AVE-BUFF may have and still be considered normal. When DIST-THRESH is set, setting portion 376 sends a compare signal 382 to a comparing portion 384 which compares the value of ENERGY-VAL with DIST-THRESH.

If ENERGY-VAL is greater than DIST-THRESH, then comparing portion 384 issues a YES event signal 386 to a setting portion 388 (FIG. 5B). YES event signal 386 triggers setting portion 388 to set STATE to EVENT-STATE because the magnitude value of ENERGY-VAL is greater than the magnitude value of a normal energy value as determined by DIST-THRESH. Setting portion 388 also set counters COUNT and HIGH-COUNT to 0. Additionally, setting portion 388 sets a threshold value EVENT-THRESH to equal the product of a multiplier EVENT-MULT and AVERAGE. When EVENT-THRESH is set, setting portion 388 sends an exit 392 to an exit portion 394.

If ENERGY-VAL is less than or equal to DIST-THRESH, comparing portion 384 (FIG. 5A) issues a NO event signal 373 to an updating portion 375. In responses to NO event signal 373, updating portion 375 subtracts the magnitude value of the energy value pointed to by AVE-PTR in AVE-BUFF from ACCUMULATOR and adds the energy value stored in ENERGY-VAL to ACCUMULATOR. Thus, ACCUMULATOR is updated by replacing the first energy value stored in AVE-BUFF with the energy value stored ENERGY-VAL. When ENERGY-VAL is added to ACCUMULATOR, updating portion 375 sends a set signal 377 to another setting portion 379.

In response to setting signal 377, setting portion 379 loads ENERGY-VAL into a memory position pointed to by AVE-PTR in AVE-BUFF. Setting portion 379 also updates and calculates AVERAGE by dividing the new value for ACCUMULATOR with AVE-BUFF-SIZE. When AVERAGE is updated, setting portion 379 issues an increment signal 381 to an incrementing portion 383 to move AVE-PTR to the next memory position within AVE-BUFF and sends a compare signal 385 to a comparing portion 387.

In response to compare signal 385, compare portion 387 compares AVE-PTR with AVE-BUFF-SIZE to determine whether AVE-PTR is pointing to a memory position within AVE-BUFF. If AVE-PTR is pointing at a memory position outside AVE-BUFF i.e. AVE-PTR is greater than or equal to AVE-BUFF-SIZE, then comparing portion 387 sends a YES reset signal 389 to a resetting portion 391 to reset or move AVE-PTR to the beginning of AVE-BUFF. When AVE-PTR is re-positioned, resetting portion 391 sends an exit signal 393 to normal exit portion 394 (FIG. 5B).

If AVE-PTR, in comparing portion 387, points at a memory position within AVE-BUFF, i.e. AVE-PTR is less than AVE-BUFF-SIZE, comparing portion 387 issues a NO reset signal 395 to normal exit portion 394. In response to exit signals 392 and 395, normal exit portion 394 sends the increment signal 228 (FIG. 2B) to the incrementing portion 226, which moves the LOOP-COUNTER forward to the next memory position of input buffer 80, and the next iteration proceeds as described above.

Since STATE is already set to NORMAL-STATE (FIG. 4), and ENERGY-VAL is equal to or less than DIST-THRESH (FIG. 5A), comparing portions 252 and 278 issue NO signals 276 and 286 respectively. Thus, the iteration of the NORMAL subroutine 294 continues as long as ENERGY-VAL remains less than DIST-THRESH. However, if ENERGY-VAL is greater than DIST-THRESH, which triggers setting portion 388 (FIG. 5B) to set STATE to EVENT-STATE, then comparator 288 (FIG. 2B) issues a NO signal 298 to an EVENT-STATE comparing portion or comparator 300. In response to signal 298, the comparator 300 compares the values of STATE and EVENT-STATE. Since the STATE value was set to that of EVENT-STATE by setting portion 388, the comparator 300 issues a YES signal 304 to an EVENT subroutine 306.

FIG. 6 describes the EVENT subroutine 306 in detail. An event-entering or entrance portion 400 receives the YES signal 304 and issues a compare signal 402 in response thereto to a comparing portion 404. Comparing portion 404 compares ENERGY-VAL with the value of EVENT-THRESH. If ENERGY-VAL is greater than EVENT-THRESH, then comparing portion 404 issues a NO event signal 406 to an incrementing portion 408 to increment COUNT. If ENERGY-VAL is equal to or less than EVENT-THRESH, then comparing portion 404 issues a YES event signal 410 to an incrementing portion 412 which increments the value of HIGH-COUNT.

Incrementing portion 412 then sends an increment signal 414 to incrementing portion 408, which increments the value of COUNT. Thus, HIGH-COUNT is only incremented if ENERGY-VAL is greater than EVENT-THRESH. When COUNT is incremented, incrementing portion 408 sends a compare signal 416 to a comparing portion 418. In response to compare signal 416, comparing portion 418 compares the value of COUNT with the value of a predetermined value EVENT-SIZE. EVENT-SIZE is a predetermined value which indicates the number of energy values being greater than DIST-THRESH that are required to set STATE to EVENT-STATE. If COUNT is less than EVENT SIZE, then comparing portion 418 issues a NO reset signal 422 to an exit portion 424.

If COUNT is equal to or greater than EVENT-SIZE, comparing portion 418 issues a YES reset signal 426 to a setting portion 428 which sets STATE to RESET-STATE. When STATE is reset, setting portion 428 issues a compare signal 430 to a comparing portion 432 which compares the value of HIGH-COUNT to the value of an integer limit EVENT-LIMIT. EVENT-LIMIT is an integer which determines the number of energy values being greater than EVENT-THRESH that are required to set STATE to SERIOUS-STATE. If HIGH-COUNT is less than EVENT-LIMIT, comparing portion 432 sends a NO serious signal 436 to an event exit portion 442.

If, on the other hand, HIGH-COUNT is equal to or greater than EVENT-LIMIT, comparing portion 432 issues a YES serious signal 438 to a setting portion 440. In response to YES serious signal 438, setting portion 440 sets STATE to SERIOUS-STATE. Setting portion 440 also sets COUNT and HIGH-COUNT to zero and sends an exit signal 442 to exit portion 424. In response to either exit signal 422, 436 or 442, an event exit portion 444 issues the increment signal 228 (FIG. 2B) to incrementing portion 226 to advance the LOOP-COUNTER pointer, and continue the next iteration as described above.

If STATE is set to SERIOUS-STATE as a result of HIGH-COUNT being greater than EVENT-LIMIT in comparing portion 432 (FIG. 6), all the comparing portions except the SERIOUS-STATE comparator 312, issue NO signals. The SERIOUS-STATE comparator 312 then issues a YES signal 316 to a "SERIOUS" subroutine 318.

Figure 7:
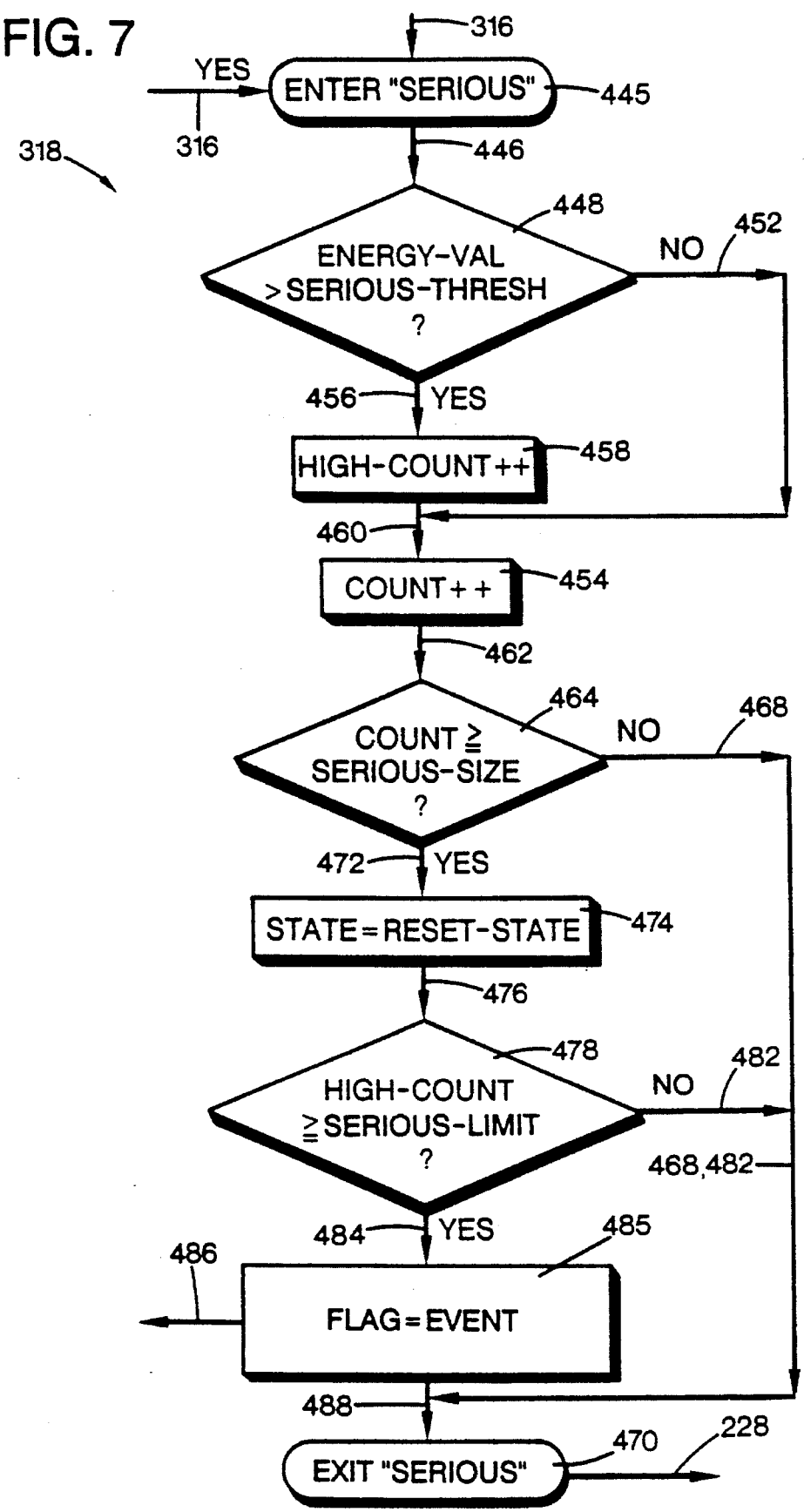
FIG. 7 is a flow chart illustrating one form of a serious subroutine of FIG. 2B.

Referring to FIG. 7, an entering or entrance portion 445 receives YES serious signal 316 and in response thereto sends a compare signal 446 to a comparing portion 448 which compares ENERGY-VAL to SERIOUS-THRESH. If ENERGY-VAL is equal to or less than SERIOUS-THRESH, comparing portion 448 sends a NO serious signal 452 to an incrementing portion 454 which increments COUNT. If ENERGY-VAL is greater than SERIOUS-THRESH, comparing portion 448 sends a YES serious signal 456 to an incrementing portion 458 which increments HIGH-COUNT.

Similar to EVENT portion 306, described in FIG. 6, HIGH-COUNT is only incremented if ENERGY-VAL is greater than SERIOUS-THRESH. When HIGH-COUNT is incremented, incrementing portion 458 sends an increment signal 460 to incrementing portion 454 to increment COUNT. When COUNT is incremented, incrementing portion 454 issues a compare signal 462 to a comparing portion 464 to compare the value of COUNT with a predetermined value SERIOUS-SIZE. SERIOUS-SIZE is a value for determining the number of energy values required to indicate that a serious event has occurred on the power line. If COUNT is less than SERIOUS-SIZE, comparing portion 464 issues a NO serious signal 468 to exit portion 470.

If COUNT is equal to or greater than SERIOUS-SIZE, comparing portion 464 sends a YES serious signal 472 to a setting portion 474 which resets STATE to RESET-STATE. When STATE is reset, setting portion 474 issues a compare signal 476 to a comparing portion 478 which compares the value of HIGH-COUNT with an integer limit SERIOUS-LIMIT. SERIOUS-LIMIT is an integer limit for the counter HIGH-COUNT, which may indicate that a serious arcing fault exists on the power line. If HIGH-COUNT is equal to or greater than SERIOUS-LIMIT, comparing portion 478 issues a YES event signal 484 to a flag setting portion 485 which sets FLAG to EVENT to indicate that a serious arcing fault exist on the power line. A flag signal 486 may optionally be sent back to microcomputer system 48 for further analysis. Setting portion 486 then sends an exit signal 488 to exit portion 470. If HIGH-COUNT is less than SERIOUS-LIMIT, then comparing portion 478 sends a NO event signal 482 to exit portion 470. In response to either signal 468, 482 or 488, the exit portion 470 issues the increment signal 228 (FIG. 2B) to the incrementing portion 226, and the next iteration proceeds as described above.

Figure 8:
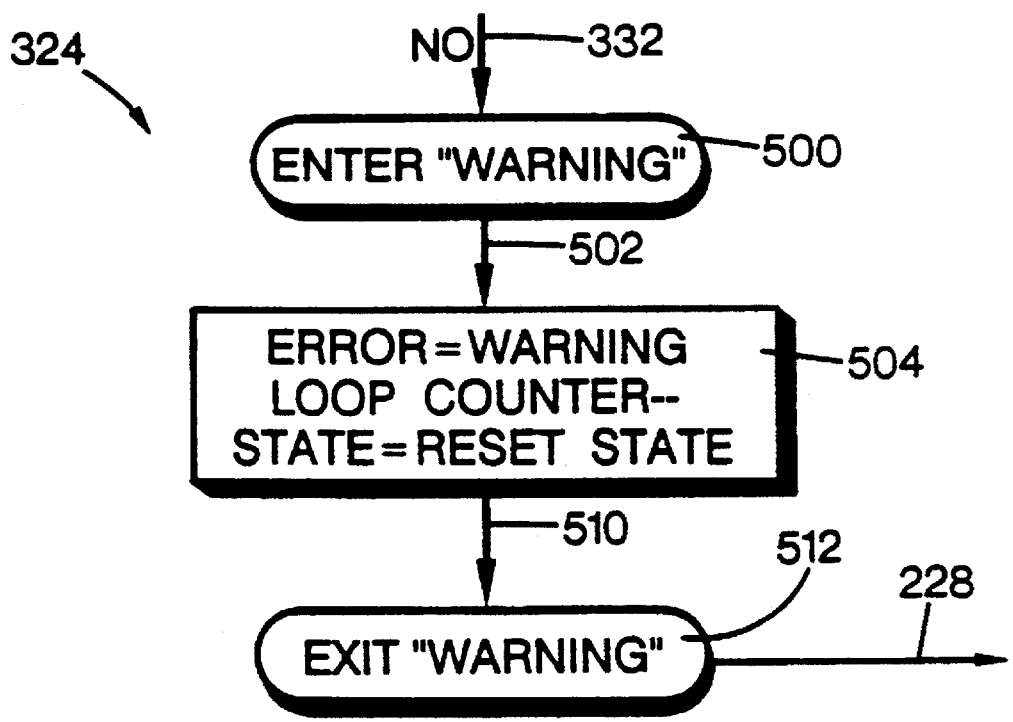
FIG. 8 is a flow chart illustrating one form of a warning subroutine of FIG. 2B.

If STATE, in comparing portion 312, is not set to SERIOUS-STATE then comparing portion 312 sends a NO serious signal 332 to a WARNING subroutine 324 shown in detail in FIG. 8. The WARNING subroutine 324 has an entering or entrance portion 500 which receives the NO signal 332. In response to the NO signal 332, the entrance portion 500 issues a set signal 502 to a setting portion 504 which sets an error value ERROR to a warning mode WARNING. Setting portion also decrements LOOP-COUNTER and sets STATE to RESET-STATE. When STATE is reset, setting portion 504 sends an exit signal 510 to an exit portion 512.

In response to exit signal 510, exit portion issues an increment signal 326 to incrementing portion 272. As described earlier, LOOP-COUNTER is moved forward to point at the next energy value stored in input buffer 80 and the system enters the RESET subroutine 250 since STATE is set to RESET-STATE. The iteration continues as described above until the LOOP-COUNTER pointer is equal to the NUM-DATA value as determined by comparator 224. The values established by the iteration are saved by portion 236 and the return FLAG portion 240 alerts the microcomputer system 48 that the iteration is complete.

Conclusion

Having illustrated and described the principles of our invention with respect to a preferred embodiment, it should be apparent to those skilled in the art that our invention may be modified in arrangement and detail without departing from such principles. For example, while the illustrated embodiment has been implemented in computer software, or discussed in terms of devices, it is apparent that structural equivalents of the various components and devices may be substituted as known to those skilled in the art to perform the same functions. Furthermore, while various hardware devices, such as the transducer, sampler and microcomputer system are illustrated, it is apparent that other devices known to be interchangeable by those skilled in the art may be substituted. We claim all such modifications falling within the scope and spirit of the following claims.

I claim:

1. A method of detecting high impedance faults occurring on a power line carrying a load current, comprising the steps of:

(a) sampling said load current to obtain sampled load current signals near the fundamental frequency of said load current;

(b) analyzing said sampled load current signals to obtain energy values that are stored in an accummulator;

(c) calculating an average of said energy values;

(d) sampling said load current to obtain a new sampled load current signal near the fundamental frequency of said load current;

(e) analyzing said new sampled load current signal to obtain a new energy value;

(f) comparing said new energy value to a first threshold value derived from said average;

(g) determining whether said new energy value exceeds said first threshold value, and if so, sampling said load current to obtain event state load current signals near the fundamental frequency of said load current;

(h) analyzing said event state load current signals to obtain event state energy values; and (i) assessing said event state energy values to identify a sudden and sustained change in energy level indicative of a dangerous arcing fault on said power line.

2. The method of claim 1 wherein said determining step includes the step of adding said new energy value to said accumulator when said new energy value does not exceed said first threshold value.

3. The method of claim 2 further comprising the step of deleting a value from said accumulator before said adding step.

4. The method of claim 1 wherein said assessing step includes the step of comparing said event state energy values to a second threshold value to identify a sudden and sustained change in energy level indicative of a dangerous arcing fault on said power line.

5. The method of claim 4 wherein said assessing step includes the step of comparing said event state energy values to a third threshold value to identify a sudden and sustained change in energy level indicative of a dangerous arcing fault on said power line.

* * * * *